United States Patent [19]

McClure

[11] Patent Number: 5,115,146
[45] Date of Patent: May 19, 1992

[54] POWER-ON RESET CIRCUIT FOR CONTROLLING TEST MODE ENTRY

[75] Inventor: David C. McClure, Carrollton, Tex.

[73] Assignee: SGS-Thomson Microelectronics, Inc., Carrollton, Tex.

[21] Appl. No.: 569,000

[22] Filed: Aug. 17, 1990

[51] Int. Cl.⁵ .......................................... H03K 17/22
[52] U.S. Cl. .................................. 307/272.3; 307/594
[58] Field of Search ...................... 307/272.3, 594, 597, 307/603, 605, 360

[56] References Cited

U.S. PATENT DOCUMENTS

| | | | |
|---|---|---|---|
| 4,446,381 | 5/1984 | Dalrymple | 307/272.3 |
| 4,654,849 | 3/1987 | White, Jr. et al. | 371/21 |
| 4,788,454 | 11/1988 | Tanagawa et al. | 307/272.3 |
| 4,797,584 | 1/1989 | Agati et al. | 307/272.3 X |
| 4,860,259 | 8/1989 | Tobita | 365/201 |
| 4,866,984 | 12/1989 | Nakaoka | 307/272.3 |

OTHER PUBLICATIONS

McAdams, et al., "A 1-Mbit CMOS Dynamic RAM With Design-For Test Functions", *IEEE Journal of Solid-State Circuits* (Oct. 1986), vol. SC-21, No. 5, pp. 635-642.
Shimada, et al., "A 46-ns 1-Mbit CMOS SRAM", *IEEE Journal of Solid-State Circuits* (Feb. 1988), vol. 23, No. 1, pp. 53-58.

Primary Examiner—David Hudspeth
Attorney, Agent, or Firm—Rodney M. Anderson; Lisa K. Jorgenson; Richard K. Robinson

[57] ABSTRACT

A power-on reset circuit is disclosed, of the type having a latch which powers up into a preferred state, and which also has a timed switch for switching the latch after a selected duration of time following the power supply voltage reaching a threshold level. The disclosed power-on reset circuit further includes a reset circuit for discharging the output node of the latch upon loss of an adequate level for the power supply voltage. The reset circuit includes a discharging transistors which has its gate biased to a voltage above that of the threshold voltage of the discharging transistor, so that full discharge of the output of the latch is ensured. Alternate configurations of the reset circuit are disclosed. In each case, the timed switch is also re-enabled by the operation of the reset circuit so that the power-on reset circuit is ready to respond to renewed powering-up of the power supply voltage. The disclosed power-on reset circuits, including the reset circuit, thus provide full and prompt reset of the power-on signal even in the event of brief power supply loss.

24 Claims, 2 Drawing Sheets

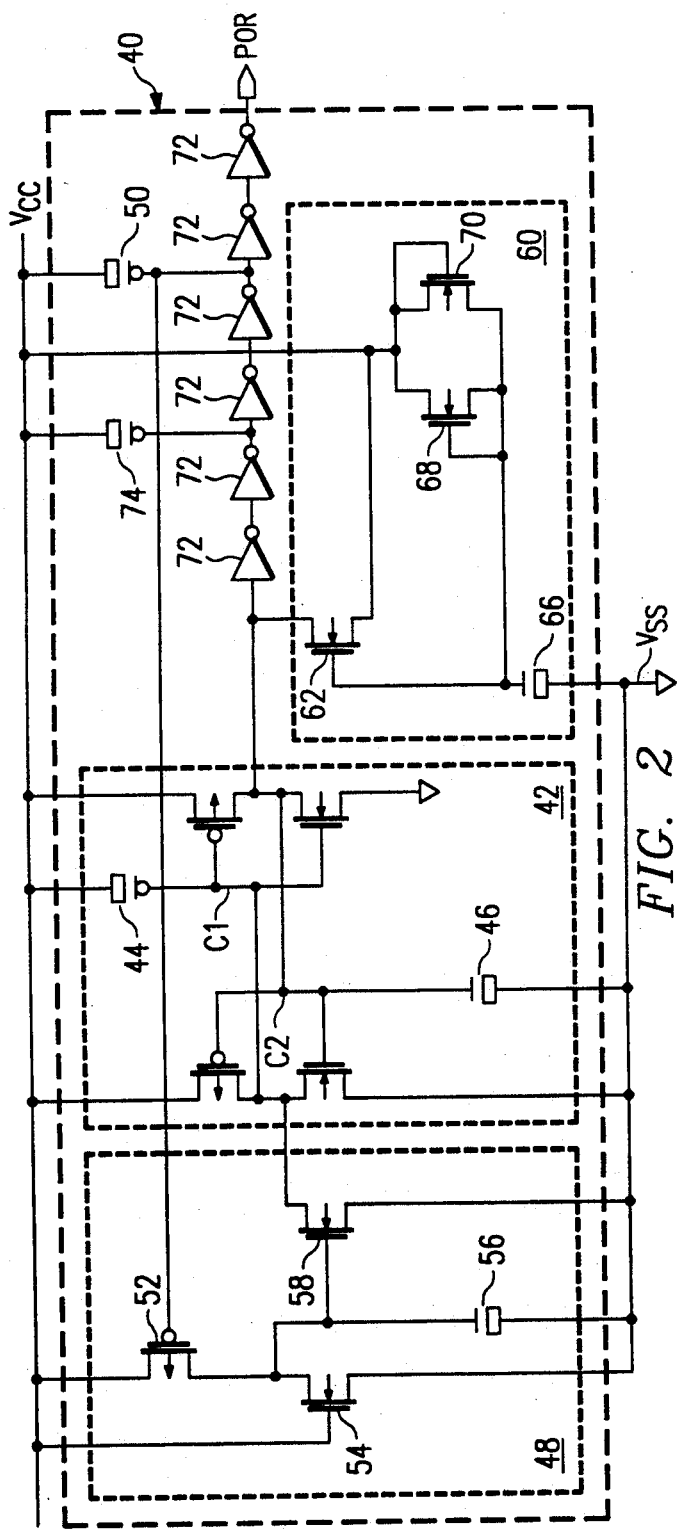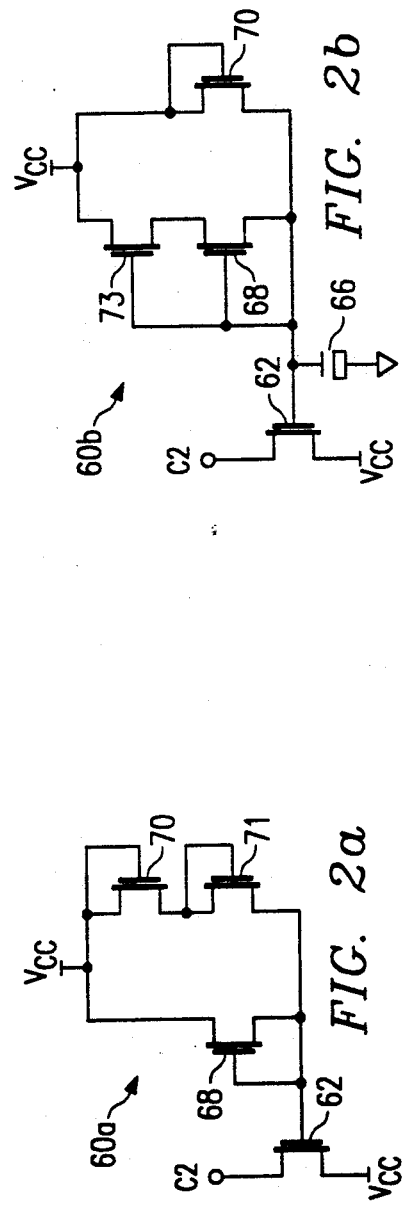

POWER-ON RESET CIRCUIT FOR CONTROLLING TEST MODE ENTRY

This invention is in the field of semiconductor memories, and is specifically directed to the entry into special test modes for such memories.

This application is related to application Ser. No. 552,567, filed June 29, 1990, incorporated herein by this reference. This application is also related to applications Ser. Nos. 569,009, 568,968, 570,148, 570,149, 569,002, and 570,124, all incorporated herein by reference, all contemporaneously filed with this application. All of these applications are assigned to SGST-Thomson Microelectronics, Inc.

BACKGROUND OF THE INVENTION

In modern high density memories, such as random access memories having $2^{20}$ bits (1 Megabit) or more, the time and equipment required to test functionality and timing of all bits in the memory constitutes a significant portion of the manufacturing cost. Accordingly, as the time required for such testing increases, the manufacturing costs also increase. Similarly, if the time required for the testing of the memory can be reduced, the manufacturing cost of the memories is similarly reduced. Since the manufacturing of memory devices is generally done in high volume, the savings of even a few seconds per device can result in significant cost reduction and capital avoidance, considering the high volume of memory devices produced.

Random access memories (RAMs) are especially subject to having significant test costs, not only because of the necessity of both writing data to and reading data from each of the bits in the memory, but also because RAMs are often subject to failures due to pattern sensitivity. Pattern sensitivity failures arise because the ability of a bit to retain its stored data state may depend upon the data states stored in, and the operations upon, bits which are physically adjacent to a particular bit being tested. This causes the test time for RAMs to be not only linearly dependent upon its density (i.e, the number of bits available for storage) but, for some pattern sensitivity tests, dependent upon the square (or 3/2 power) of the number of bits. Obviously, as the density of RAM devices increases (generally by a factor of four, from generation to generation), the time required to test each bit of each device in production increases at a rapid rate.

It should be noted that many other integrated circuit devices besides memory chips themselves utilize memories on-chip. Examples of such integrated circuits include many modern microprocessors and microcomputers, as well as custom devices such as gate arrays which have memory embedded therewithin. Similar cost pressures are faced in the production of these products as well, including the time and equipment required for testing of the memory portions.

A solution which has been used in the past to reduce the time and equipment required for the testing of semiconductor memories such as RAMs is the use of special "test" modes, where the memory enters a special operation different from its normal operation. In such test modes, the operation of the memory can be quite different from that of normal operation, as the operation of internal testing can be done without being subject to the constraints of normal operation.

An example of a special test mode is an internal "parallel", or multi-bit, test mode. Conventional parallel test modes allow access to more than one memory location in a single cycle, with common data written to and read from the multiple locations simultaneously. For memories which have multiple input/output terminals, multiple bits would be accessed in such a mode for each of the input/output terminals, in order to achieve the parallel test operation. This parallel test mode of course is not available in normal operation, since the user must be able to independently access each bit in order to utilize the full capacity of the memory. Such parallel testing is preferably done in such a way so that the multiple bits accessed in each cycle are physically separated from one another, so that there is little likelihood of pattern sensitivity interaction among the simultaneously accessed bits. A description of such parallel testing may be found in McAdams et al., "A 1-Mbit CMOS Dynamic RAM With Design-For-Test Functions", *IEEE Journal of Solid-State Circuits*, Vol SC-21, No. 5 (October 1986), pp. 635-642.

Other special test modes may be available for particular memories. Examples of tests which may be performed in such modes include the testing of memory cell data retention times, tests of particular circuits within the memory such as decoders or sense amplifiers, and the interrogation of certain portions of the circuit to determine attributes of the device such as whether or not the memory has had redundant rows or columns enabled. The above-referenced article by McAdams et al. describes these and other examples of special test functions.

Of course, when the memory device is in such a special test mode, it is not operating as a fully randomly accessible memory. As such, if the memory is in one of the test modes by mistake, for example when installed in a system, data cannot be stored and retrieved as would be expected for such a memory. For example, when in parallel test mode, the memory writes the same data state to a plurality of memory locations. Accordingly, when presented with an address in parallel test mode, the memory will output a data state which does not depend solely on the stored data state, but may also depend upon the results of the parallel comparison. Furthermore, the parallel test mode necessarily reduces the number of independent memory locations to which data can be written and retrieved, since four, or more, memory locations are simultaneously accessed. It is therefore important that the enabling of the special test modes be accomplished in such a manner that the chance is low that a special test mode will be inadvertently entered.

Prior techniques for entry into special test mode include the use of a special terminal for indicating the desired operation. A simple prior technique for the entry into test mode is the presentation of a logic level, high or low, at a dedicated terminal to either select the normal operation mode or a special test mode such as parallel test, as described in U.S. Pat. No. 4,654,849. Another approach for the entry into test mode using such a dedicated terminal is disclosed in Shimada et al., "A 46-ns 1-Mbit CMOS SRAM", *IEEE Journal of Solid-State Circuits*, Vol. 23, No. 1, (Feb. 1988) pp. 53-58, where a test mode is enabled by the application of a high voltage to a dedicated control pad while performing a write operation. These techniques are relatively simple but they of course require an additional terminal besides those necessary for normal memory operation.

While such an additional terminal may be available when the memory is tested in wafer form, significant test time also occurs after packaging, during which special test modes are also useful. In order to use this technique of a dedicated test enable terminal for package test, it is therefore necessary that the package have a pin or other external terminal for this function. Due to the desires of the system designer that the circuit package be as small as possible, with as few connections as possible, the use of a dedicated pin for test mode entry is therefore undesirable. Furthermore, if a dedicated terminal for entering the test mode is provided in packaged form, the user of the memory must take care to ensure that the proper voltage is presented to this dedicated terminal so that the test mode is not unintentionally entered during system usage.

Another technique for enabling special test modes is the use of an overvoltage signal at one or more terminals which have other purposes during normal operation, such overvoltage indicating that the test mode is to be enabled, such as is also described in U.S. Pat. No. 4,654,849, and in U.S. Pat. No. 4,860,259 (using an overvoltage on an address terminal). Said U.S. Pat. No. 4,860,259 also describes a method which enables a special test mode in a dynamic RAM responsive to an overvoltage condition at the column address strobe terminal, followed by the voltage on this terminal falling to a low logic level. The McAdams et al. article cited hereinabove, describes a method of entering test mode which includes the multiplexing of a test number onto address inputs while an overvoltage condition exists on a clock pin, where the number at the address inputs selects one of several special test modes. Such overvoltage enabling of special test modes, due to its additional complexity, adds additional security that special test modes will not be entered inadvertently, relative to the use of a dedicated control terminal for enabling the test modes.

However, the use of an overvoltage signal at a terminal, where that terminal also has a function during normal operation, still is subject to inadvertent enabling of the special mode. This can happen during "hot socket" insertion of the memory, where the memory device is installed into a location which is already powered up. Depending upon the way in which the device is physically placed in contact with the voltages, it is quite possible that the terminal at which an overvoltage enables test mode is biased to a particular voltage before the power supply terminals are so biased. The overvoltage detection circuit conventionally used for such terminals compares the voltage at the terminal versus a power supply or other reference voltage. In a hot socket insertion, though, the voltage at the terminal may be no higher than the actual power supply voltage, but may still enable the special mode if the terminal sees this voltage prior to seeing the power supply voltage that the terminal is compared against. Accordingly, even where special test modes are enabled by an overvoltage signal at a terminal, a hot socket condition may still inadvertently enable the special mode.

It should also be noted that similar types of inadvertent enabling of special test modes can occur during power up of the device, if the transients in the system are such that a voltage is presented to the terminal at which an overvoltage selects the test mode, prior to the time that the power supply voltage reaches the device. Furthermore, due to the random nature in which internal nodes of the device can power-up, many prior devices can power up in the special test mode even without the presentation of such signals.

The inadvertent test mode entry is especially dangerous where a similar type of operation is required to disable the test mode. For example, the memory described in the McAdams et al. article requires an overvoltage condition, together with a particular code, to return to normal operation from the test mode. In the system context, however, there may be no way in which an overvoltage can be applied to the device (other than the hot socket or power up condition that inadvertently placed the device in test mode). Accordingly, in such a system, if the memory device is in test mode, there may be no way short of powering down the memory in which normal operation of the memory may be regained.

It is therefore an object of this invention to provide an improved circuit and method for inhibiting the enabling of a special mode in an integrated circuit device during power-up of the device after a brief power-down event.

In addition, it should be noted that conventional power-on reset circuits are used in the art for the control of certain operations other than entry into test mode in a device until power-up is achieved. It has been found that such circuits may not reset in the event of brief losses of power, so that upon return of the power supply to its nominal voltage, the power-on reset function is lost.

It is therefore a further object of this invention to provide an improved circuit and method which resets quickly in the event of loss of power supply voltage, so that inhibition of circuit functions during power-up is effected after such brief power losses.

Other objects and advantages of the invention will become apparent to those of ordinary skill in the art having reference to this specification together with its drawings.

SUMMARY OF THE INVENTION

The invention may be incorporated into a power-on reset circuit by providing a reset circuit therein which quickly resets the state of the power-on reset circuit to the power-down state, in the event of a power loss. The power-on reset circuit may include a latch which powers up in a preferential state, and which is switched by a timed switch at a period of time after power-up. The reset circuit is connected to a node of the latch, and includes a switch which discharges the node so that the latch quickly returns to its preferential state upon loss of power supply voltage. The power-on reset circuit may be used to inhibit such functions as entry into a special test mode during power-up.

BRIEF DESCRIPTION OF THE DRAWINGS

FIG. 2 is an electrical diagram, in schematic form, of a first embodiment of a power-on reset circuit, including a reset circuit therewithin, according to the preferred embodiment of the invention.

FIG. 2a and 2b are electrical diagrams, in schematic form, of alternative embodiments of the reset circuit for the power-on reset circuit of FIG. 2.

DETAILED DESCRIPTION OF THE PREFERRED EMBODIMENT

Figure 1:
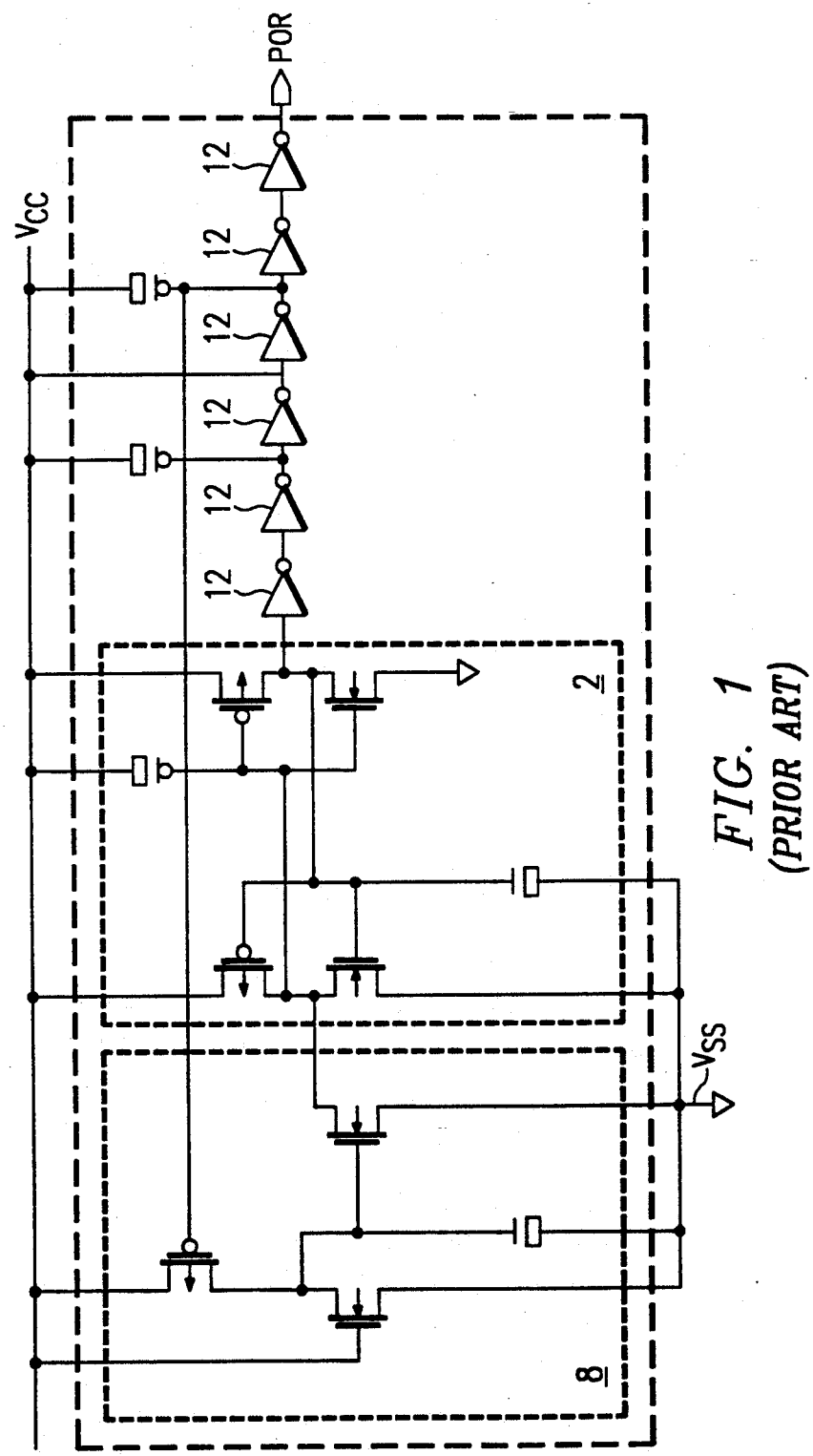
FIG. 1 is an electrical diagram, in schematic form, of a conventional power-on reset circuit.

Referring now to FIG. 2, the preferred construction and operation of power-on reset circuit 40 according to this embodiment of the invention will now be described. Power-on reset circuit 40 receives the power supply voltage $V_{cc}$ and the ground reference voltage $V_{ss}$. $V_{cc}$ and $V_{ss}$ bias the transistors in CMOS latch 42. Latch 42 is a conventional latch constructed of cross-coupled CMOS inverters, and also includes capacitor 44 connected between $V_{cc}$ and cross-coupled node C1 therein, and capacitor 46 which is connected between $V_{ss}$ and the other cross-coupled node C2 therein. As will be described in further detail hereinbelow, capacitors 44 and 46 preset latch 42 upon power-up of the memory or other integrated circuit incorporating power-on reset circuit 40.

Latch 42 communicates its logic state to line POR, via a string of inverters 72 connected to cross-coupled node C2. The number of inverters 72 in this string (in this embodiment six), determines the delay time between the switching of latch 42 and the transition of line POR. Within the string of inverters 72, one plate of capacitor 50 is connected to the input of an inverter 72 which is an odd number of inverters from node C2 (in this case, at the input of the fifth inverter 72 from node C2), with the other plate connected to $V_{cc}$. Also within the string of inverters 72, capacitor 74 is connected on one side to the input of one of inverters 72, preferably an inverter 72 which is an odd number of inverters from node C2 (in this case, capacitor 74 is connected to the input of the third inverter 72 from node C2) and has its other plate connected to $V_{cc}$. Capacitor 74 serves to stabilize the operation of power-on reset circuit 40 so that it does not rapidly oscillate in the event of $V_{cc}$ making small excursions about the trip point of the circuit; capacitor 74 also slows the operation of the chain of inverters 72, as will be discussed in more detail hereinbelow.

Power-on reset circuit 40 further includes timed switch 48 biased between $V_{cc}$ and $V_{ss}$. $V_{cc}$ is connected to the source of a p-biased channel transistor 52 which has its gate connected to the plate of capacitor 50 which is connected within the chain of inverters 72. The drain of transistor 52 is connected to the drain of an n-channel transistor 54, which has its gate tied to $V_{cc}$ and its source biased by $V_{ss}$. Transistor 52 is preferably larger than transistor 54, with the W/L on the order of 10 and 4, respectively. The drains of transistors 52 and 54 are connected to one plate of a capacitor 56, which has its opposing plate tied to $V_{ss}$, and to the gate of transistor 58, which has its drain connected to cross-coupled node C1 of latch 42, and which has its source of $V_{ss}$. As will be apparent in the description of the operation hereinbelow, timed switch 48 causes latch 42 to change its state at a period of time after the powering up of $V_{cc}$.

It should be noted that the provision of latch 42, timed switch 48, and the delay chain of inverters 72, are conventional in power-on reset circuits. FIG. 1 illustrates an example of such a conventional power-on reset circuit, including latch 2, timed switch 8, and a delay chain of inverters 12. Such conventional power-on circuits, not including a reset circuit such as reset circuit 60 shown in FIG. 2, are subject to inaccurate operation in the event of brief power losses if the state of the power-on circuit is not quickly reset in the event of a power loss. If the power supply is lost and then restored before the power-on reset circuit has had time to return to its proper initial state, the power-on reset circuit will be immediately issuing the signal to the remainder of the circuit (i.e., the same signal as it was issuing at the time of power loss) that power-on has fully occurred, and enable normal operation of the circuit, before full power-up occurs. This allows the remainder of the circuit to initialize in a random, and therefore potentially undesirable, state. An example of such an undesired state is a special test mode.

According to this embodiment of the invention, however, power-on reset circuit 40 further includes reset circuit 60, which ensures that the state of power-on reset circuit 40 is fully and quickly reset upon power supply $V_{cc}$ falling below a certain level. Reset circuit 60 includes n-channel transistor 62, which has its source-to-drain path connected between cross-coupled node C2 of latch 42 and $V_{cc}$, and has its gate coupled to one plate of capacitor 66, which has its other plate connected to $V_{ss}$. The gate of transistor 62 is further connected to the sources of transistors 68 and 70. N-channel transistors 68 and 70 each have their drains connected to $V_{cc}$; the gate of transistor 68 is connected to the gate of transistor 62, and the gate of transistor 70 is connected to $V_{cc}$. As will be discussed hereinbelow relative to the operation of reset circuit 60, it is preferable that transistor 62 be constructed so that it has a threshold voltage which is lower than that of transistor 68. As is well known in the art, this can be done by way of different threshold adjust ion implantation for transistors 62 and 68, or alternatively by making the W/L ratio of transistor 62 significantly greater than that of transistor 68.

The operation of power-on reset circuit 40, including reset circuit 60, will now be described beginning from a state in which no power is applied to $V_{cc}$, and as the integrated circuit is powered up. As $V_{cc}$ ramps up from an unpowered condition, capacitors 44 and 46 will cause latch 48 to set in a state where node C1 is at a high level and node C2 is at a low level, due to the action of capacitors 44 and 46 respectively connected thereto. A low logic level at cross-coupled node C2 will present, via the six inverters 72, a low logic level at line POR. This indicates to the remainder of the integrated circuit that it is not yet sufficiently powered up. As will be described further hereinbelow, this will prevent entry into an indeterminate state, such as into a special test mode. In this initial state, transistor 62 in reset circuit 60 remains off, as its gate (at capacitor 66) has not yet charged up through transistor 70.

As power-up begins, the gate of transistor 52 in timed switch 48, connected to the plate of capacitor 50 which is also connected to the input of an odd inverter 72 following node C2, is at a low logic level since node C2 is low. Transistor 52 is thus turned on as $V_{cc}$ rises above a certain level during power up; while transistor 54 is also turned on, due to transistor 52 being much larger than transistor 54 the node at the drains of transistors 52 and 54 is pulled toward $V_{cc}$. After power supply $V_{cc}$ reaches a certain level as it powers up, for example 3.3 volts, and since the gate of transistor 58 follows the drain of transistor 52, transistor 58 also turns on, pulling node C1 low toward $V_{ss}$. This will pull cross-coupled node C1 to a low logic level, and switches latch 42 so that a high logic level is presented at node C2. After the time necessary to ripple through chain of inverters 72, including charging up capacitor 50 at the input of the fifth inverter 72 in the chain, line POR goes to a high logic level, and indicates to the remainder of the integrated circuit, including evaluation logic 30, that power-up has occurred. An example of a preferred delay time between the point in time at which $V_{cc}$ reaches the trip level and the issuing of a high logic level on line POR is on the order of ten nanoseconds.

Once the high logic level at node C2 has rippled through the chain of inverters 72, capacitor 50 is charged in such a state that the gate of transistor 52 is at a high voltage, which turns off p-channel transistor 52. At this time, due to the operation of transistor 54 with its gate at $V_{cc}$, the gate of transistor 58 is pulled low, turning off transistor 58. This allows node C1 to be held at a low logic level by the operation of latch 42, but with no external driving voltage applied thereto. As a result, reset circuit 60 can easily reset latch 42 to its prior state, in the event of a loss of voltage at power supply $V_{cc}$.

Also after power-up, due to the operation of n-channel transistor 70, the gate of transistor 62 is at a voltage approximately $V_{cc}-V_{t70}$ ($V_{t70}$ being the threshold voltage of transistor 70), which turns transistor 62 on. This connects node C2 to $V_{cc}$ through transistor 62, which further assists the holding of node C2 high and, by operation of latch 42, assists the holding of node C1 low. Accordingly, latch 42 remains in this state for so long as $V_{cc}$ remains powered up, with the powered up state indicated by a high logic level on line POR.

In the event that the voltage of power supply $V_{cc}$ falls to a certain level below its nominal operating level, however, power-on reset circuit 40 will be reset by reset circuit 60. As $V_{cc}$ falls toward zero volts, the gate of transistor 62 will follow $V_{cc}$ while remaining at approximately $V_{t68}$ above the voltage of $V_{cc}$. This voltage remains at the gate of transistor 62 upon power supply $V_{cc}$ reaching zero volts, due to capacitor 66 being previously charged to $V_{cc}-V_{t70}$, and due to transistor 68 acting as a forward-biased diode. Since the threshold voltage of transistor 62 is lower than that of transistor 68, as described above, transistor 62 is on as power supply $V_{cc}$ reaches zero volts. This discharges cross-coupled node C2 of latch 42 to $V_{cc}$, which is at a low logic level (zero volts).

It should be noted that the use of an n-channel transistor 70, rather than a p-channel transistor, will be important for most CMOS implementations of the circuit of FIG. 2. As is conventional in CMOS, the n-well regions into which p-channel transistors are formed are generally biased to $V_{cc}$, to ensure that the source-to-well junctions of the p-channel transistors are not forward biased. If such a p-channel transistor were used in place of transistor 70 (of course with its gate connected to the gate of transistor 62 to implement the same function), the gate of transistor 62 would be clamped to the forward biased p-n junction voltage drop (on the order of 0.7 volts), rather than to $V_{t68}$, upon power supply $V_{cc}$ falling to ground. If the threshold voltage of transistor 62 is higher than this drop, transistor 62 would not be conductive, and reset circuit 60 would not be operable to quickly discharge node C2 in latch 42. It is therefore preferable to use n-channel transistor 70, which will present a reverse-biased diode to the gate of transistor 62 and $V_{cc}$ falls, allowing the gate of transistor 62 to fall to the voltage of $V_{t68}$.

This discharging of node C2 to ground as $V_{cc}$ falls ensures that power-on reset circuit 40 will properly operate even if the loss of voltage on $V_{cc}$ is short. Proper operation of power-on reset circuit 40 is the generation of a low logic level on line POR for a certain length of time upon power-up, i.e., until $V_{cc}$ has been above a certain level for a certain time at which time line POR returns high. Such operation requires that, for the circuit of FIG. 2, latch 42 must, on power-up, set to a state with node C1 high and node C2 low, with timed switch 48 causing the switching of latch 42 and the generation of the high logic signal on line POR thereafter. In the event of a brief loss of power, after which the proper power-on reset procedure (including the locking out of special test modes) is desired, reset circuit 60 ensures the resetting of latch 42 by discharging node C2 (and capacitor 46) through transistor 62. Without this discharge path provided by reset circuit 60, capacitor 46 may not be sufficiently discharged by way of leakage so that it would set node C2 low again upon power-up after a brief loss of voltage at power supply $V_{cc}$.

It should further be noted that capacitor 66 also slows the rate at which transistor 62 turns on as power-up begins. This ensures that it is the operation of timed switch 48 which causes latch 42 to change state on power-up, rather than the premature charging of node C2 through transistor 62. Accordingly, by way of capacitor 66, reset circuit 60 does not disturb the operation of power-on reset circuit 40 during the power-up sequence.

Referring now to FIGS. 2a and 2b, the construction and operation of alternative reset circuits 60a and 60b which may be included in power-on reset circuit 40 in place of reset circuit 60 will now be described in detail. FIG. 2a shows a first alternative reset circuit 60a which includes transistor 62, having its source-to-drain path connected between cross-coupled node C2 of latch 42 and $V_{cc}$, and having its gate connected to the source of transistor 68, as in reset circuit 60 of FIG. 2. Unlike reset circuit 60 of FIG. 2, reset circuit 60a does not include capacitor 66 connected between the gate of transistor 62 and $V_{ss}$. Transistor 68, as in the case of FIG. 2, is configured in diode fashion, with its source-to-drain path connected between $V_{cc}$ and the gate of transistor 62, and with its gate connected to the gate of transistor 62. N-channel transistors 70 and 71 are configured in diode fashion and connected in series between $V_{cc}$ and the gate of transistor 62, oriented in a direction so that they are forward biased with $V_{cc}$ positive relative to the gate of transistor 62.

Reset circuit 60a of FIG. 4a, due to series transistors 70 and 71 between $V_{cc}$ and the gate of transistor 62, delays and clamps the charging of the gate of transistor 62 during the powering up of power supply $V_{cc}$, so that transistor 62 does not turn on until after latch 42 (shown in FIG. 2) has switched. Additional transistors may be included in series with transistors 70 and 71, to further delay the turning on of transistor 62 as desired. However, in order for transistor 62 to be capable of discharging node C2 as power supply $V_{cc}$ falls, the number of transistors in series between $V_{cc}$ and the gate of transistor 62 cannot be so large that the voltage at the gate of transistor 62 is clamped at a voltage lower than its threshold voltage. If this is the case, transistor 62 will not turn on during power-up, nor will it be on during power-down, precluding the operation of reset circuit 60. It should be noted that a capacitor may be connected to the gate of transistor 62, in similar manner as capacitor 66 in FIG. 2, in combination with multiple transistors 70, 71 in the series connection of FIG. 2a, to further assist the delay in the charging of the gate of transistor 62 during power-up without affecting its clamped voltage.

Referring now to FIG. 2b, a reset circuit 60b according to another embodiment of the invention is illustrated, for use in power-on reset circuit 40 of FIG. 2, in substitution for reset circuit 60. Reset circuit 60b is constructed similarly as reset circuit 60 of FIG. 2, with the source-to-drain path of transistor 62 connected between cross-coupled node C2 of latch 42 and $V_{cc}$. The gate of transistor 62 is connected to n-channel transistor 70, and is also connected to a plate of capacitor 66. Transistor 70, as in FIG. 2, is connected in diode configuration between $V_{cc}$ and the gate of transistor 62, with its gate connected to $V_{cc}$. Reset circuit 60b also includes n-channel transistors 68 and 73, which have their source-to-drain paths connected in series between $V_{cc}$ and the gate of transistor 62, and which each have their gates connected to the gate of transistor 62. It should be noted that transistors 68 and 73 may be fabricated in such a way that their threshold voltages are the same as that of transistor 62.

As discussed above relative to FIG. 2, for reset circuits 60 (and 60a and 60b) to properly operate, transistor 62 must be on at such time as power supply $V_{cc}$ is powered down, even to zero volts. In reset circuit 60, this is accomplished by fabricating transistors 62 and 68 in such a manner that their threshold voltages differ, with the threshold voltage of transistor 62 below that of transistor 68. However, such a fabrication requirement may not be compatible with the fabrication process used to make the integrated circuit incorporating reset circuit 60. In addition, many variables in the fabrication process of integrated circuits are known to have significant effects on threshold voltages. The alternative reset circuit 60b presents a circuit which has potentially reduced process sensitivity than reset circuit 60, due to the use of series transistors 68 and 73.

In power-up, reset circuit 60b operates similarly to reset circuit 60 of FIG. 2. When power supply $V_{cc}$ is powered down, however, the voltage to which the gate of transistor 62 will fall will be held by transistors 68 and 73 is $V_{cc}+V_{t68}+V_{ds73}$, where $V_{ds73}$ is the series voltage drop of the source-to-drain path of transistor 73. Accordingly, once transistor 70 is reverse-biased in power-down, with the threshold voltage of transistors 62 and 68 equal (i.e., $V_{t62}=V_{t68}$), the voltage at the gate of transistor 62 will be higher than $V_{cc}$ (i.e., the source of transistor 62) by more than its threshold voltage. Transistor 62 will thus serve to discharge node C2 to the powered-down $V_{cc}$, resetting latch 42.

The connection of the gate of transistor 73 to the gate of transistor 72, rather than in diode configuration, is preferable in reset circuit 60b for purposes of controlling the voltage at the gate of transistor 62 when power supply $V_{cc}$ is powered up. The voltage $V_{ds73}$ is smaller in magnitude than the threshold voltage of transistor 73, and accordingly the voltage at the gate of transistor 62 is not higher than necessary to discharge cross-coupled node C2. This is beneficial because the voltage of power supply $V_{cc}$, as it powers up, will capacitively couple to the gate of transistor 62 via transistors 68, 70 and 73, and be additive with whatever voltage is present at the gate of transistor 62 at that time. As noted above, it is desirable that transistor 62 not be turned on prior to the operation of timed switch 48, as this would cause latch 42 to switch prior to full power-up of $V_{cc}$. The likelihood of such premature conduction through transistor 62 increases with higher voltages at its gate at the time of power-up of power supply $V_{cc}$. Reset circuit 60b thus keeps the voltage at the gate of transistor 62 high enough for conduction during power-down, but not excessively high, reducing the likelihood of this undesired conduction.

In the alternative reset circuit 60b, the reduced process sensitivity is obtained from the reduced dependence of the operation of the circuit on a differential threshold voltage. Indeed, transistors 62 and 68 can be fabricated to be of the identical size, and substantially at the same location in the integrated circuit, so that variations in process will tend to affect transistors 62 and 68 identically. Due to the inclusion of series transistor 73, transistor 62 will still remain on in the power-down condition sufficiently long for the latch to be reset.

Of course, relative to reset circuit 60 of FIG. 2, the alternative embodiment of reset circuits 60a and 60b of FIGS. 2a and 2b require one or more additional transistors. It is contemplated that one of ordinary skill in the art will now be able to select from one of these alternatives, or from other alternatives which will now be apparent, according to the fabrication process variations, circuit requirements, and other such factors of the particular circuit under design.

It should also be noted that reset circuits 60, 60a and 60b, while described in conjunction with the resetting of a power-on reset circuit 40 for which their operation is particularly useful and beneficial, may also be used in circuits other than power-on reset functions, and in other integrated circuits, whether or not including a memory function. For example, there may be particular nodes in such circuits which are preferably discharged quickly upon power-down of a power supply, without relying on a power-up reset circuit. It is contemplated that reset circuits 60, 60a, and 60b could be utilized to discharge such nodes, by connection to such nodes in lieu of cross-coupled node C2 which is discharged in the above description.

While the invention has been described herein relative to its preferred embodiment, it is of course contemplated that modifications of, and alternatives to, this embodiment, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A power-on reset circuit comprising:
   a latch, biased from a bias voltage terminal, and having a first state into which it enters upon the power-up of a bias voltage, said latch having an output for indicating the state of said latch;
   a timed switch circuit, having an input coupled to said bias voltage terminal, having a feedback input coupled to the output of said latch, and having an output coupled to said latch, for switching said latch to a second state upon the voltage at said bias voltage terminal exceeding a first threshold level for a selected duration of time, said timed switch circuit disabled responsive to the output of said latch indicating said second state and enabled responsive to the output of said latch indicating said first state; and
   a reset circuit, having an input coupled to said bias voltage terminal and having an output coupled to the output of said latch, for resetting the output of said latch to said first state upon the voltage at said bias voltage terminal falling below a second threshold level, thereby enabling said timed switch circuit.

2. The circuit of claim 1, wherein said first state is a preferential state and said latch.

3. The circuit of claim 1, further comprising:
a delay circuit, coupled to the output of said latch, for generating a power-on signal responsive to said latch switching to said second state and after a selected delay interval.

4. The circuit of claim 3, wherein said feedback input of said timed switch circuit is coupled to said delay circuit.

5. The circuit of claim 1, wherein said timed switch comprises:
a charging circuit, biased from said bias voltage terminal;
a capacitor, coupled to said charging circuit; and
an output device, coupled to said capacitor and to said latch, for switching said latch responsive to said capacitor being charged by said charging circuit to a threshold voltage.

6. A power-on reset circuit, comprising:
a latch comprising first and second cross-coupled inverters, biased from a bias voltage terminal, said latch having a first state into which it enters upon the power-up of a bias voltage;
a switch circuit, coupled to said bias voltage terminal and to said latch, for switching said latch to a second state upon the voltage at said bias voltage terminal reaching a first threshold level; and
a reset circuit, coupled to said bias voltage terminal and said latch, for resetting said latch to said first state upon the voltage at said bias voltage terminal falling below a second threshold level, said reset circuit comprising:
a discharge transistor having a conductive path connected between an input of said first inverter and a reset node, and having a control terminal; and
a bias device coupled between said bias voltage terminal and the control terminal of said discharge transistor.

7. The circuit of claim 6, wherein said bias device comprises a diode.

8. The circuit of claim 6, wherein said bias device comprises a bias transistor having a conductive path coupled between said bias voltage terminal and the control terminal of said discharge transistor, and having a control terminal connected to one end of its conductive path in such a manner that the voltage at the control terminal of said discharge transistor is at least a forward-biased junction voltage drop above the voltage at said bias voltage terminal.

9. The circuit of claim 8, wherein said discharge transistor is a field-effect transistor;
and wherein said forward-biased junction voltage drop is greater than the threshold voltage of said discharge transistor.

10. The circuit of claim 6, further comprising:
a capacitor connected between the control terminal of said discharge transistor and a reference voltage node.

11. The circuit of claim 10, wherein said reference voltage node is ground.

12. The circuit of claim 6, further comprising:
a clamping device, coupled between the control terminal of said discharge transistor and said bias voltage terminal, for limiting the bias of said control terminal of said discharge transistor upon the voltage at said bias voltage terminal exceeding said first threshold voltage.

13. The circuit of claim 12, wherein said clamping device comprises a diode.

14. The circuit of claim 12, wherein said clamping device comprises a clamping transistor having a conductive path coupled between said bias voltage terminal and the control terminal of said discharge transistor, and having a control terminal connected to one end of its conductive path in such a manner that the voltage at the control terminal of said discharge transistor is clamped to a forward-biased junction voltage drop below the voltage at said bias voltage terminal upon the voltage at said bias voltage terminal exceeding said first threshold voltage.

15. A method of generating a signal in an integrated circuit responsive to power up of a voltage at a power supply terminal, comprising:
setting a latch, upon power up of said power supply terminal, so that its output presents a first state;
initiating a timed period beginning from the time that the voltage at said power supply terminal reaches a first threshold voltage;
switching said latch to present a second state responsive to the expiration of said timed period;
resetting said timed period responsive to said switching step;
discharging the output node of said latch to said first state upon the voltage at said power supply terminal falling below a second threshold level, said discharging step enabling the initiating step to be performed;
repeating said initiating, switching and resetting steps responsive to the voltage at said power supply terminal reaching said first threshold voltage after said discharging step; and
driving said signal responsive to said output node of said latch.

16. The method of claim 15, wherein said discharging step comprises:
coupling said output node to said power supply terminal responsive to the voltage at said power supply terminal falling below said second threshold level.

17. The circuit of claim 15, wherein said initiating step comprises charging a capacitor;
and wherein said resetting step comprises discharging said capacitor responsive to said output node of said latch being discharged to said first state.

18. A method of generating a signal in an integrated circuit responsive to power up of a voltage at a power supply terminal, comprising:
setting an output node in a latch from a first state to a second state upon the voltage at said power supply terminal reaching a first threshold voltage;
discharging said output node to said first state upon the voltage at said power supply terminal falling below a second threshold level by biasing the gate of a discharging transistor coupled between said output node and said power supply terminal to an on-state responsive to the voltage at said power supply terminal falling below said second threshold level; and
driving said signal responsive to said output node of said latch.

19. The method of claim 18, wherein said biasing step comprises:

charging the control terminal of said discharging terminal to an on-state responsive to the voltage at said power supply terminal exceeding said first threshold level; and retaining the voltage at the control terminal at said on-state after the voltage at said power supply terminal falls below said second threshold level.

20. The method of claim 19, further comprising the step of delaying said charging step responsive to said power supply terminal reaching said first threshold level until after said setting step.

21. The method of claim 19, further comprising:

clamping the control terminal of said discharging transistor to a voltage below the voltage at said power supply terminal when above said first threshold level.

22. A power-on reset circuit, comprising:

a latch, biased from a bias voltage terminal, and having a first preferential state into which it enters upon the power-up of a bias voltage, wherein said latch comprises:

first and second cross-coupled inverters; and a capacitor, coupled between the input of said first inverter and a reference voltage node, said capacitor for coupling the input of said first inverter to said reference voltage node;

a switch circuit, coupled to said bias voltage terminal and to said latch, for switching said latch to a second state upon the voltage at said bias voltage terminal reaching a first threshold level; and a reset circuit, coupled to said bias voltage terminal and said latch, for resetting said latch to said first state upon the voltage at said bias voltage terminal falling below a second threshold level.

23. The circuit of claim 22, wherein said reference voltage node is coupled to said bias voltage terminal.

24. The circuit of claim 22, wherein said reference voltage node is coupled to a ground terminal.

* * * * *